(12) United States Patent
Kim et al.

(10) Patent No.: US 11,715,679 B2
(45) Date of Patent: Aug. 1, 2023

(54) POWER STAGE PACKAGE INCLUDING FLEXIBLE CIRCUIT AND STACKED DIE

(71) Applicant: TEXAS INSTRUMENTS INCORPORATED, Dallas, TX (US)

(72) Inventors: Woochan Kim, San Jose, CA (US); Vivek Kishorechand Arora, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 315 days.

(21) Appl. No.: 16/597,808

(22) Filed: Oct. 9, 2019

(65) Prior Publication Data
US 2021/0111105 A1    Apr. 15, 2021

(51) Int. Cl.
*H01L 23/538* (2006.01)
*H01L 23/495* (2006.01)
(Continued)

(52) U.S. Cl.
CPC .... *H01L 23/49575* (2013.01); *H01L 21/4885* (2013.01); *H01L 23/481* (2013.01); *H01L 23/5383* (2013.01); *H01L 23/5384* (2013.01); *H01L 23/5387* (2013.01); *H01L 23/5389* (2013.01); *H01L 25/0657* (2013.01); *H01L 25/072* (2013.01); *H01L 25/165* (2013.01); *H02M 3/156* (2013.01); *H02M 1/0012* (2021.05)

(58) Field of Classification Search
CPC ... H01L 25/162; H01L 25/0657; H01L 25/16; H01L 25/072; H01L 23/5387; H01L 25/165; H01L 23/5383; H01L 21/4885; H01L 23/5384; H01L 23/481

USPC ............... 257/678, 686, 691, 723, 724, 777, 257/25.011, 25.023, 25.03; 438/107, 108, 438/109
See application file for complete search history.

(56) References Cited

U.S. PATENT DOCUMENTS 5,241,454 A * 8/1993 Ameen .................. H05K 1/144
29/430
5,403,784 A   4/1995 Hashemi et al.
(Continued)

OTHER PUBLICATIONS

LMG5200 80-V, 10A GaN Half-Bridge Power Stage, Texas Instruments Incorporated, Dallas, Texas, Oct. 2018.
(Continued)

*Primary Examiner* — David Chen
(74) *Attorney, Agent, or Firm* — Dawn Jos; Frank D. Cimino

(57) ABSTRACT

A semiconductor package includes a substrate, a set of terminals protruding from a first surface of the substrate, a power stage physically and thermally coupled to the first surface of the substrate, and a flexible circuit including at least one circuit layer forming power stage conductors and control circuit conductors disposed on a flexible insulating substrate layer. The power stage is between the flexible circuit and the substrate and is mounted on a first surface of the flexible circuit such that the power stage is electrically connected to the power stage conductors. The package includes a die mounted on a second surface of the flexible circuit opposite the power stage. An output of the die is electrically connected to an input of the power stage via the control circuit conductors.

18 Claims, 8 Drawing Sheets

(51) Int. Cl.
  *H01L 25/065*    (2023.01)
  *H02M 3/156*     (2006.01)
  *H01L 25/07*     (2006.01)
  *H01L 25/16*     (2023.01)
  *H01L 21/48*     (2006.01)
  *H01L 23/48*     (2006.01)
  *H02M 1/00*      (2006.01)

(56) References Cited

U.S. PATENT DOCUMENTS

| | | | |
|---|---|---|---|
| 5,438,224 A | 8/1995 | Papageorge et al. | |
| 5,569,625 A | 10/1996 | Yoneda et al. | |
| 5,663,597 A | 9/1997 | Nelson et al. | |
| 6,396,136 B2 | 5/2002 | Kalidas et al. | |
| 6,574,107 B2 | 6/2003 | Jeon et al. | |
| 7,135,759 B2 | 11/2006 | Efland et al. | |
| 7,838,340 B2 | 11/2010 | Cruz et al. | |
| 8,299,588 B1 | 10/2012 | Tateishi et al. | |
| 8,354,303 B2 | 1/2013 | Lopez et al. | |
| 8,450,149 B2 | 5/2013 | Bayan et al. | |
| 8,524,532 B1 | 9/2013 | Joshi | |
| 8,822,273 B2 | 9/2014 | Kuo et al. | |
| 8,884,414 B2 | 11/2014 | Lee et al. | |
| 8,946,880 B2 | 2/2015 | Saye | |
| 9,177,945 B2 | 11/2015 | Saye | |
| 9,300,222 B2 | 3/2016 | Moss | |
| 9,373,571 B2 | 6/2016 | Denison et al. | |
| RE46,466 E | 7/2017 | Lange et al. | |
| 10,056,819 B1 | 8/2018 | Couleur et al. | |
| 2002/0056562 A1* | 5/2002 | Skrzypchak | H01L 23/315 |
| | | | 174/522 |
| 2008/0224285 A1* | 9/2008 | Lim | H01L 23/49575 |
| | | | 257/E23.092 |
| 2009/0086454 A1* | 4/2009 | Sakamoto | H05K 5/065 |
| | | | 361/796 |
| 2009/0218666 A1* | 9/2009 | Yang | H01L 23/5387 |
| | | | 257/677 |
| 2010/0284159 A1* | 11/2010 | Sakamoto | H05K 5/065 |
| | | | 361/752 |
| 2012/0300522 A1* | 11/2012 | Tokuyama | H01L 24/34 |
| | | | 363/131 |
| 2013/0001797 A1* | 1/2013 | Choi | H01L 25/105 |
| | | | 257/774 |
| 2013/0127029 A1 | 5/2013 | Lee et al. | |
| 2013/0333835 A1* | 12/2013 | Carcia | H01L 51/448 |
| | | | 427/255.35 |
| 2015/0116945 A1* | 4/2015 | Minamio | H01L 25/07 |
| | | | 361/709 |
| 2015/0380335 A1* | 12/2015 | Takematsu | H01L 24/01 |
| | | | 257/77 |
| 2016/0172279 A1 | 6/2016 | Cho | |
| 2017/0125324 A1 | 5/2017 | Joshi et al. | |
| 2017/0331371 A1* | 11/2017 | Parto | H02M 3/156 |
| 2018/0040593 A1* | 2/2018 | Zhou | H01L 23/5384 |
| 2019/0013288 A1 | 1/2019 | Kim et al. | |
| 2019/0287887 A1* | 9/2019 | Nakamura | H01L 25/072 |

OTHER PUBLICATIONS

U.S. Appl. No. 16/222,920, titled Package With Dual Layer Routing Including Ground Return Path, filed Dec. 17, 2018.

Steger, With Sinter-Technology Forward to Higher Reliability of Power Modules for Automotive Applications, Power Electronics Europe, Issue 2, pp. 28-31, Munich, Germany, Mar. 2012.

* cited by examiner

POWER STAGE PACKAGE INCLUDING FLEXIBLE CIRCUIT AND STACKED DIE

TECHNICAL FIELD

This disclosure relates to semiconductor packages.

BACKGROUND

Semiconductor technology continues long-term trends towards miniaturization, integration, and speed. Electronic products in commercial applications such as telecom, home audio, and regulator products often need power supply systems, which can switch power supplies, regulate and stabilize voltages, and/or work as power converters, such as AC to AC, AC to DC, DC to AC and DC to DC converters.

Popular power switch systems involve a metal leadframe onto which a plurality of discrete electronic components are assembled and overmolded as a unit. In operation, the components have to stay cool by effectively dissipating heat to heat sinks so that they can switch fast (fast transient response).

Intelligent power modules combine power supply, regulation, and switching components with dedicated controllers. The dedicated controllers may provide features intended to improve performance and reliability, such as over-current protection, over-temperature protection, and under voltage lockout. The components of an intelligent power module, such as low voltage controllers, sensors, and control dies, as well as high-voltage power switches, such as power field effect transistors (FETs) are interconnected through a common underlying circuit, such as a printed circuit board (PCB).

BRIEF SUMMARY

Packages disclosed herein include a semiconductor die forming a power stage and a control die on opposing surfaces of a flexible circuit. The semiconductor die is physically and thermally coupled to a substrate opposite the flexible circuit to facilitate conductive cooling from the semiconductor die. A control signal output of the control die is electrically connected to an input of the semiconductor die via the flexible circuit. The disclosed techniques may be applied to integrate a control die and semiconductor die including a power stage within a single package.

Components of varying heights may be mounted on both sides of the flexible circuit. For example, the flexible circuit may conform to components of varying heights that are first mounted via their backsides on the comparatively stiff substrate before electrical connection to the flexible circuit. During assembly of the package, the flexible circuit bends to align electrical contact pads of the flexible circuit with the electrical contacts of the components with varying heights.

In some examples, the flexible circuit provides a ground return path within the package. Including a ground return path within the package provides for a lower impedance for electronic signals between the semiconductor die and a die as compared to packages that rely on the ground plane of an underlying circuit. Limiting the impedance of the signal path may mitigate voltage overshoot, thereby facilitating higher frequency communications, as voltage overshoot can interfere with signal transmission.

In one example, a semiconductor package includes a substrate forming a first surface and a second surface that opposes the first surface, a set of terminals protruding from the first surface of the substrate, a power stage physically and thermally coupled to the first surface of the substrate, and a flexible circuit including at least one circuit layer forming power stage conductors and control circuit conductors disposed on a flexible insulating substrate layer, wherein the power stage is mounted on a first surface of the flexible circuit such that the power stage is electrically connected to the power stage conductors. The flexible circuit is opposite the substrate relative the power stage such that the power stage is between the flexible circuit and the substrate. The semiconductor package further includes a die mounted on a second surface of the flexible circuit opposite the power stage such that the die is electrically connected to the control circuit conductors. An output of the die is electrically connected to an input of the power stage via the control circuit conductors.

In another example, a method of forming a package includes physically and thermally coupling a power stage to a first surface of a substrate to form a first subassembly, the substrate forming the first surface and a second surface that opposes the first surface. A set of terminals protrude from the first surface of the substrate. The method further includes mounting a die on a first surface of a flexible circuit such that the die is electrically connected to a control circuit conductors of the flexible circuit to form a second subassembly, the flexible circuit including at least one circuit layer forming power stage conductors and control circuit conductors disposed on a flexible insulating substrate layer, the flexible circuit forming the first surface and a second surface that opposes the first surface of the flexible circuit. The method further includes aligning alignment features of the flexible circuit of the second subassembly with the set of terminals of first assembly to locate electrical contacts of the power stage with electrical contact surfaces of the power stage conductors on the second surface of the flexible circuit. Electrically connecting the electrical contacts of the power stage with the electrical contact surfaces of the power stage conductors to electrically connect the power stage of the first subassembly to the power stage conductors of the second subassembly.

In another example, a semiconductor package includes a substrate forming a first surface of the substrate, and a second surface of the substrate, the second surface of the substrate opposing the first surface of the substrate, a set of terminals protruding from the first surface of the substrate, a first gallium nitride die forming a first power stage physically and thermally coupled to the first surface of the substrate, a second gallium nitride die forming a second power stage physically and thermally coupled to the first surface of the substrate, and a flexible circuit including a power stage circuit layer and a control circuit layer separated by a flexible insulating substrate layer. The first gallium nitride die is mounted on a first surface of the flexible circuit such that the first power stage is electrically connected to the power stage circuit layer, and the second gallium nitride die is mounted on the first surface of the flexible circuit such that the second power stage is electrically connected to the power stage circuit layer. The first power stage is electrically connected to the second power stage via the power stage circuit layer. The flexible circuit is opposite the substrate relative the first power stage and the second power stage such that the first power stage and the second power stage are between the flexible circuit and the substrate. The flexible circuit forms alignment features engaged with the set of terminals protruding from the substrate. The semiconductor package further includes a die mounted on the flexible circuit opposite the first power stage and the second power stage such that the die is electrically connected to the control circuit layer. An output terminal of the die is electrically connected to an input for at least one of the first power stage and the second power stage via one of the set of terminals. The semiconductor package further includes mold compound at least partially covering the first gallium nitride die, the second gallium nitride die, the die, the flexible circuit and the substrate with the second surface of the substrate exposed.

DETAILED DESCRIPTION

Figure 1A:
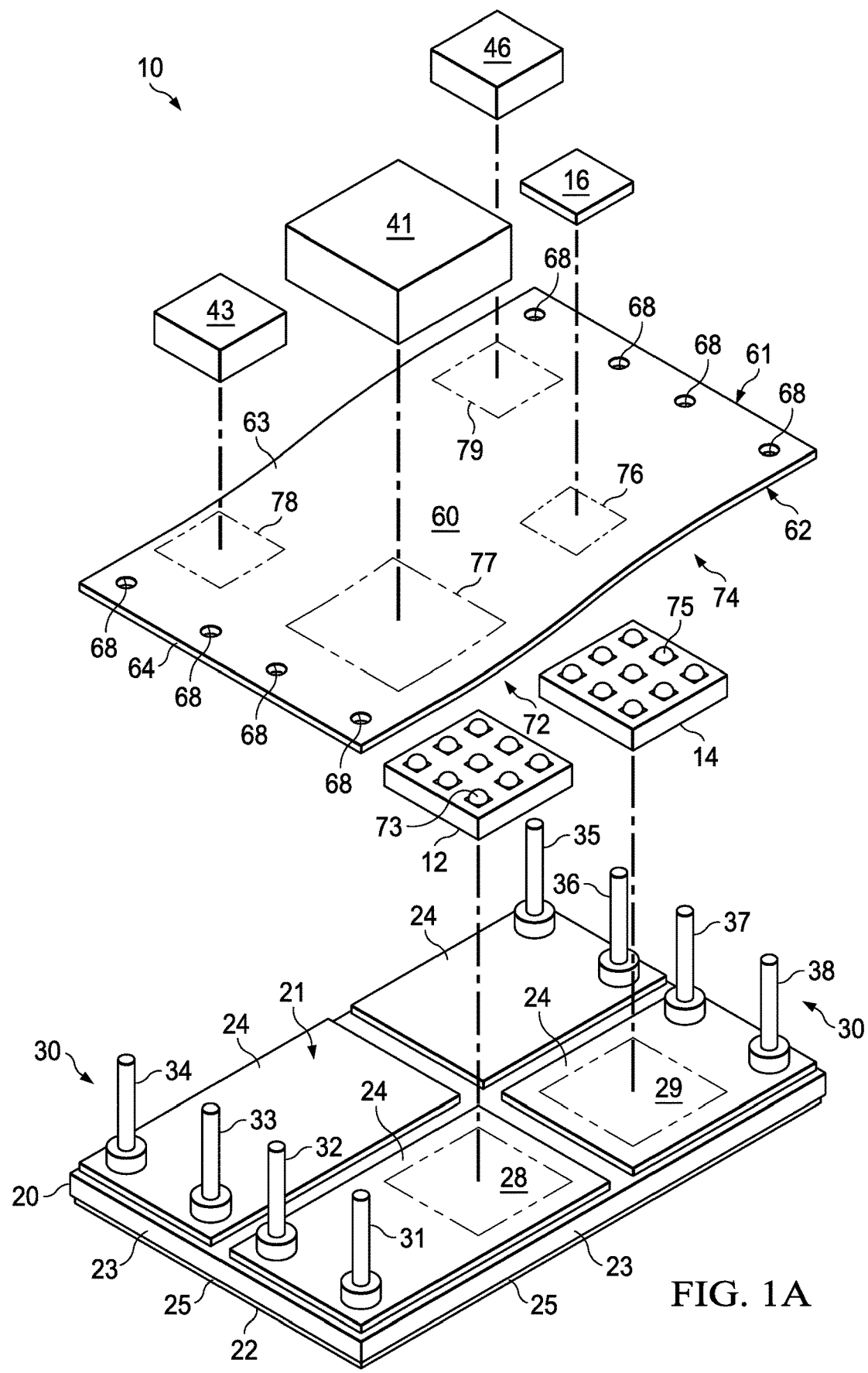
FIGS. 1A-1C illustrate a semiconductor package including FET power stages in a half-bridge configuration and a control die on opposing surfaces of a flexible circuit.

In contrast to the availability of integrated power converters, such a buck converters, intelligent power modules tend to be larger assemblies with limited integration. Power switches and their control die circuits may include a number of components electrically connected through a common underlying circuit, such as a PCB. The separation of components in an intelligent power module supports cooling of the components, allows the same components to be used in a wide number of applications, and allows customization of the control die circuit.

However, the separation of components of intelligent power module may also limit the speed of control signals and switching due to the impedance of the control signal loop. For example, a control signal loop includes the direct electrical connection between a control die and a power stage as well as a ground return path. Larger physical control signal loops result in larger impedances. Further integration of power switch components supports faster switching and efficiency.

As disclosed herein, packages include a flexible circuit with one or more conductive layers interconnecting components of the package. By way of non-limiting example, a flexible circuit generally includes at least one conductive layer, such as copper, aluminum or silver, disposed on a flexible dielectric substrate, such as polymide, PEEK, polyester. The conductive layer(s) may be applied by printing, such as photolithography or laser imaging. Flexible circuits variations include single-sided, double-sided, and multilayer flexible circuits. In some examples, conductive layers are covered with dielectric layers with the exception of electrical contacts. In other examples conductive layers may remain exposed on an outer surface of a flexible circuit.

In other applications, flexible circuits are commonly used as connectors where flexibility and/or manufacturing constraints provide advantages over rigid circuit boards or direct wiring, including personal electronic devices such as smart phones, laptops. Common applications also include connections between stationary and moving components, such as a moving arm carrying read write heads in a disk drive, and the moving head of printers. In this present example, the use of flexible circuits allows compact design and simplified electrical connections to components of varying heights within the package.

Different flexible circuit designs may facilitate bend radius under 25 millimeters, such as under 10 millimeters, such as under 5 millimeters. The thickness of the layers of a flex circuit are important to provide flexibility. In various examples, thicknesses of conductive layers may be less than 0.020 inches, such as between 0.0001 and 0.010 inches. In the same or different examples, thickness of dielectric layers may also be less than 0.020 inches, such as between 0.0005 and 0.010 inches. The thicknesses may be selected according to current and voltage requirements and to provide flexibility suitable for a given application.

In specific examples, a package may include a semiconductor die forming a power stage and a control die on opposing surfaces of a flexible circuit, such as the flexible circuit variations described above and other variations. The semiconductor die is physically and thermally coupled to a substrate opposite the flexible circuit to facilitate conductive cooling from the semiconductor die. A control signal output of the control die is electrically connected to an input of the semiconductor die via the flexible circuit. The disclosed techniques may be applied to integrate a control die and semiconductor die including a power stage within a single package.

Components of varying heights may be mounted on both sides of the flexible circuit. For example, the flexible circuit may conform to components of varying heights that are first mounted via their backsides on a comparatively stiff substrate before electrical connection to the flexible circuit. During assembly of the package, the flexible circuit bends to align electrical contact pads of the flexible circuit with the electrical contacts of the components with varying heights.

The flexible circuit supports 3D signal routing with multiple circuit layers, which can be interconnected via pin terminals and/or conductive vias in the flexible circuit substrate that span between the conductive circuit layers of the flexible circuit. In some examples, the 3D signal routing in the flexible circuit provides a ground return path within the package. Including a ground return path within the package provides for a lower impedance for electronic signals between the semiconductor die and a control die as compared to packages that rely on the ground plane of an underlying circuit. Limiting the impedance of the signal path may mitigate voltage overshoot, thereby facilitating higher frequency communications, as voltage overshoot can interfere with signal transmission.

With an integrated control die, the direct electrical connection between a control die and a power stage is limited to the signal conductor within the package. By further including a ground return path within the package, the impedance loop may be further limited by being fully contained within conductors of the package. Limiting the impedance of the signal loop may mitigate voltage overshoot of the electronic signals between semiconductor dies, thereby facilitating higher frequency communications between the semiconductor dies. The disclosed techniques are applicable to any semiconductor dies, and may be particularly useful higher frequency transmissions, such as gallium nitride (GaN) dies. For example, GaN architecture, such as GaN-on-silicon or GaN-on-silicon carbide, have been demonstrated as supporting higher frequencies as compared to silicon architecture or gallium arsenide architecture.

The disclosed techniques further address cooling for the power stage. For example, in high voltage applications, such as voltages of at least 80 volts (DC and/or AC), power stage components on the high voltage side of an intelligent power module (as opposed to control die components, which operate at a low voltage and/or low power) may generate significant heat which needs to be dissipated to allow for reliable and continued operation of all components in the intelligent power module. As an example, a semiconductor die forming the power stage may be arranged on a substrate to facilitate heat transfer therethrough. Package 10, as described with respect to FIGS. 1A-1C, provides one example of these techniques.

Figure 1B:
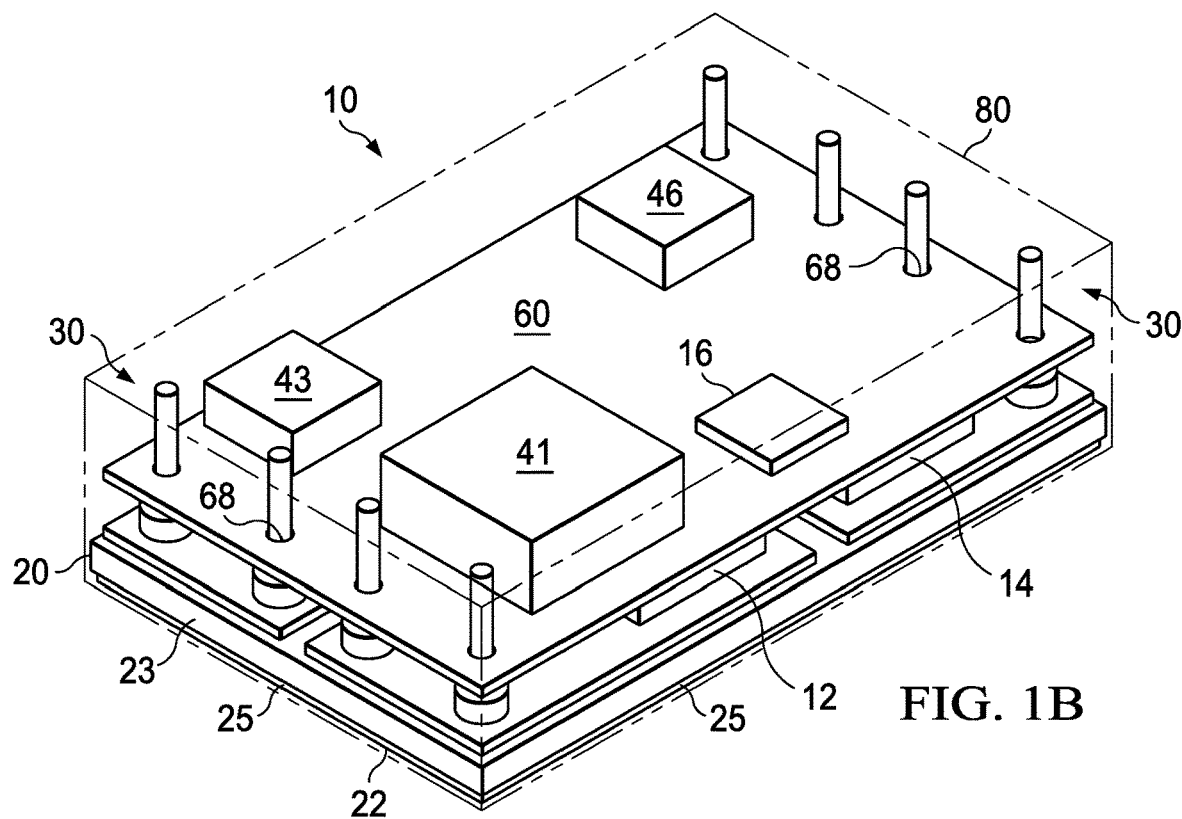
Figure 1C:
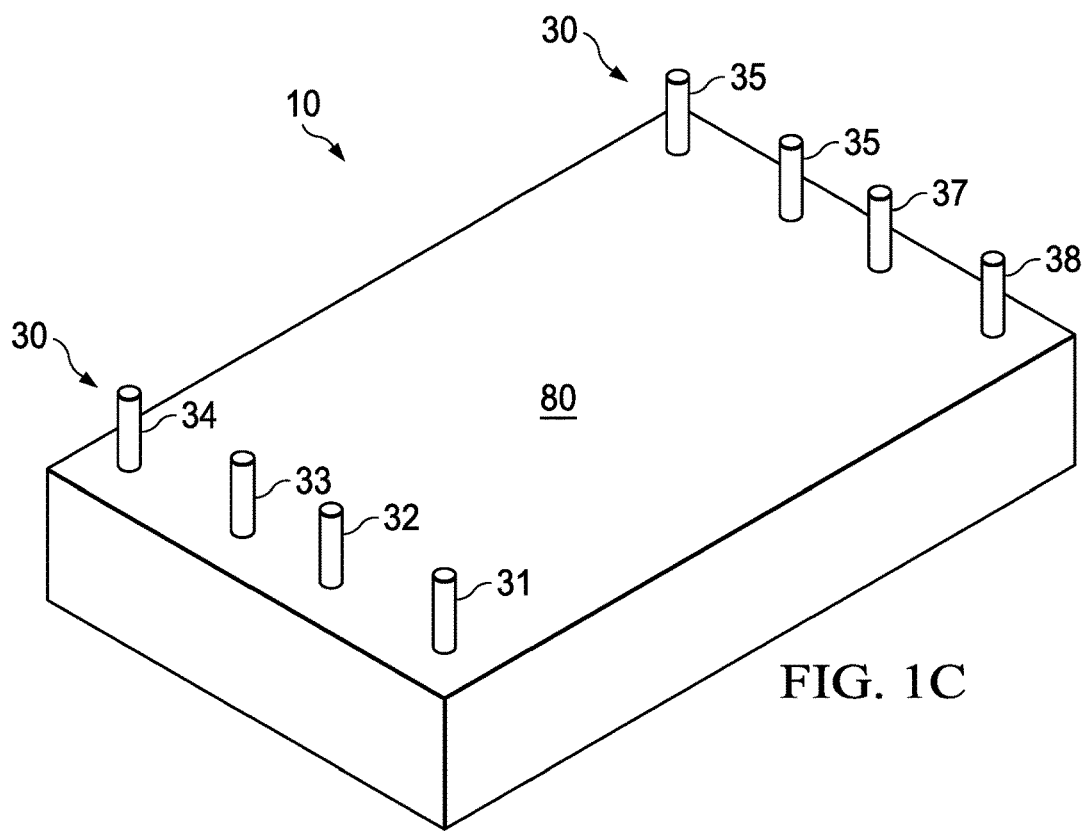

FIGS. 1A-1C illustrate semiconductor package 10. Specifically, FIG. 1A is an exploded view of package 10, while FIG. 1B is a perspective view of package 10 with mold compound 80 shown in hidden lines. FIG. 1C is a perspective view of package 10 showing mold compound 80 and a protruding set of pin terminals 30.

Package 10 includes semiconductor dies 12, 14, each forming a power stage, such as a single channel power FET, and a control die 16 on opposing surfaces of flexible circuit 60, the power stages and control die each being electrically connected to circuit layers of the flexible circuit. Semiconductor die 12 is mounted in a flipchip arrangement with its solder ball grid array 73 electrically connected at die attach site 72, semiconductor die 14 is mounted in a flipchip arrangement with its solder ball grid array 75 electrically connected at die attach site 74, and control die 16 is mounted in a flipchip arrangement at die attach site 76. While solder ball grid arrays 73, 75 are depicted, dies 12, 14 may connect to flexible circuit 60 using any kind of bump including solder balls, copper pillar, copper pillar with tin (Sn) cap or other bump. Control die 16 may also include a solder ball grid array (not shown) or other bumps, such as copper pillars or copper pillars with tin caps to connect at die attach site 76.

Control die 16 is a semiconductor die, such as an integrated circuit, configured to control the power switch elements of semiconductor dies 12, 14. Package 10 further includes a substrate 20 and mold compound 80. The backsides of semiconductor dies 12, 14, are physically and thermally coupled to surface 21 of substrate 20 opposite flexible circuit 60. The opposing surface 22 of substrate 20 is exposed to facilitate conductive cooling of semiconductor dies 12, 14 via substrate 20.

Semiconductor die 12, 14 are in flip chip configurations on surface 62 of flexible circuit 60. Control die 16 is also in a flip chip configuration on the opposing surface 61 of flexible circuit 60. Control signal outputs of control die 16, such as FET driver signals, are electrically connected to inputs of semiconductor die 12, 14 via circuit layers of flexible circuit 60. Package 10 further includes passive components 41, 43, 46, which are arranged on the same surface of flexible circuit 60 as control die 16 such that such that each of passive components 41, 43, 46 are physically and electrically connected to conductive elements of flexible circuit 60, and, optionally, pin terminals 30.

Within package 10, flexible circuit 60 includes one or more conductive circuit layers that provide the electrical connections between active and passive electronic components of package 10. The active components of package 10 include semiconductor dies 12, 14, each forming a power stage, and control die 16. Passive components 41, 43 and 46 are illustrated and may represent capacitors, resistors, inductors or other passive components. In some examples, semiconductor dies 12, 14 and one or more of passive components 41, 43 and 46 may be arranged in a half-bridge.

Semiconductor dies 12, 14, each form at least one power stage, such as an FET, a junction FET (JFET), a metal-oxide-semiconductor field-effect transistor (MOSFET), a metal-semiconductor field-effect transistor (MESFET), an insulated-gate bipolar transistor (IGBT), a bipolar junction transistor (BJT), a thyristor, an integrated gate commutated thyristor (IGCT), a silicon controlled rectified (SCR), a triode for alternating current (TRIAC), a high electron mobility transistor (HEMT), a unijunction transistor (UJT), or other power stage or combination thereof. In various examples, semiconductor dies 12, 14 may form more than one power stage, such as a half bridge, a power converter, such as a Buck converter or boost converter, or other power switch configuration. Any suitable semiconductor technology may be used for semiconductor dies 12, 14 and the power stage(s), including, but not limited to, silicon, GaN, silicon carbide (SiC), aluminum nitride (AlN), indium nitride (InN), boron nitride (BN), and silicon-germanium (SiGe).

Flexible circuit 60 forms die attach sites 72, 74, 76 for mounting semiconductor dies 12, 14 and control die 16 on opposing surfaces of flexible circuit 60. Specifically, die attach site 76 is on surface 61 of flexible circuit 60, and die attach sites 72, 74 are on surface 62, which opposes surface 61 of flexible circuit 60. The die attach sites are formed by electrical contact pads corresponding to electrical contacts on the associated die to facilitate electrical connections therebetween. Semiconductor die 12 is mounted in a flipchip arrangement with its solder ball grid array 73 electrically connected at die attach site 72, semiconductor die 14 is mounted in a flipchip arrangement with its solder ball grid array 75 electrically connected at die attach site 74, and control die 16 is mounted in a flipchip arrangement at die attach site 76. Control die 16 may also include a solder ball grid array (not shown) or other electrical contacts to connect at die attach site 76.

Flexible circuit 60 also forms component attach sites 77, 78, 79 for mounting passive components 41, 43, 46 to surface 61 of flexible circuit 60. Component attach sites 77, 78, 79 are formed by electrical contact pads corresponding to electrical contacts on the associated component to facilitate electrical connections therebetween. The electrical connections between passive components 41, 43, 46 and electrical contacts on component attach sites 77, 78, 79 may be formed with solder reflow of solder balls or other techniques.

Figure 3A:
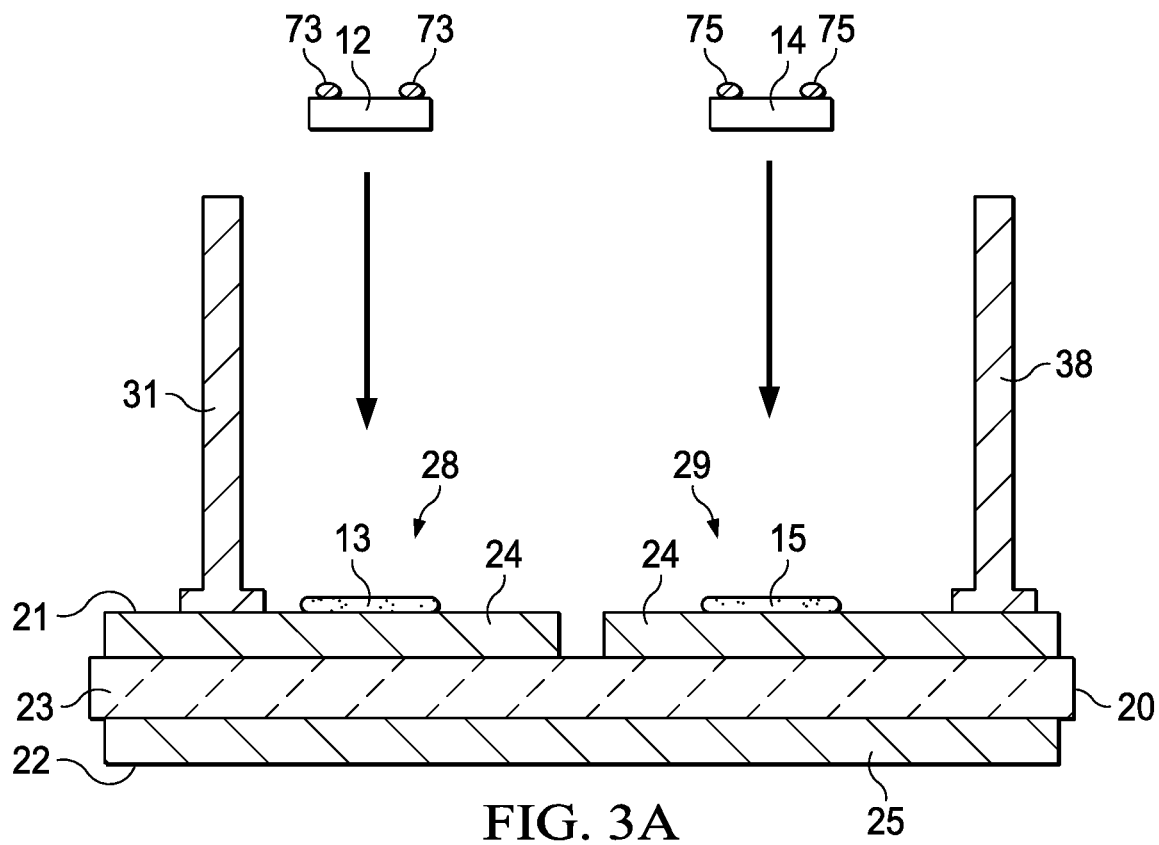
FIGS. 3A-3H illustrate conceptual process steps for manufacturing the semiconductor package of FIGS. 1A-1C.
Figure 3B:
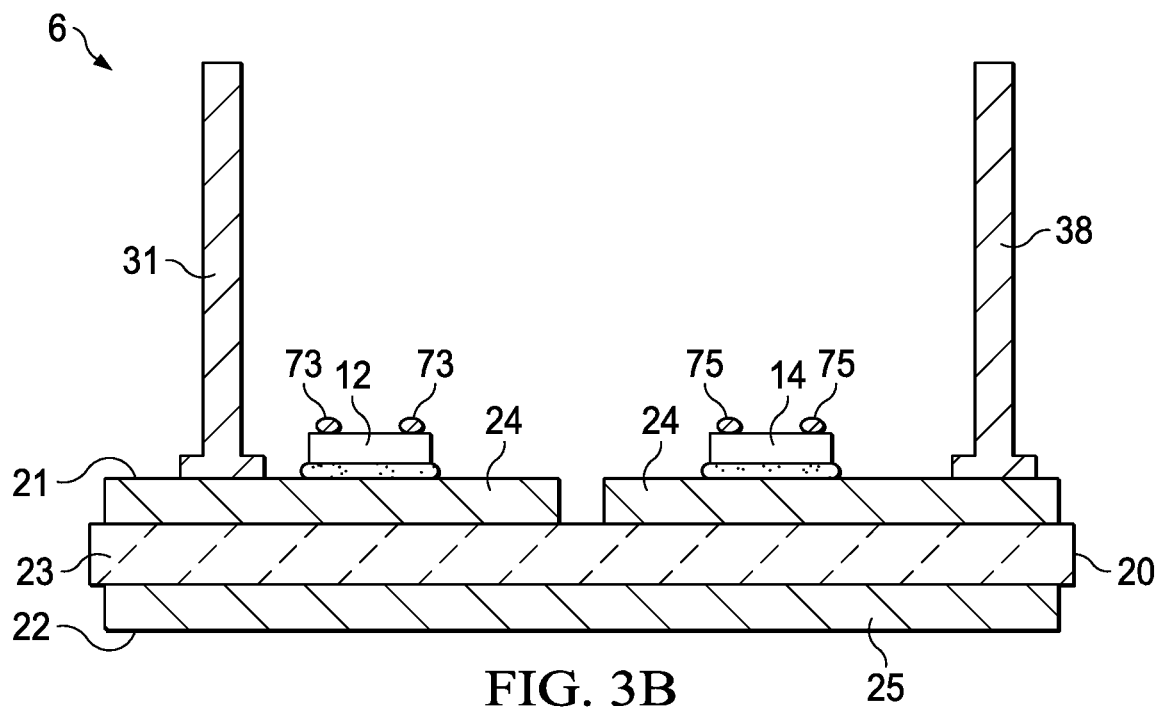
Figure 3C:
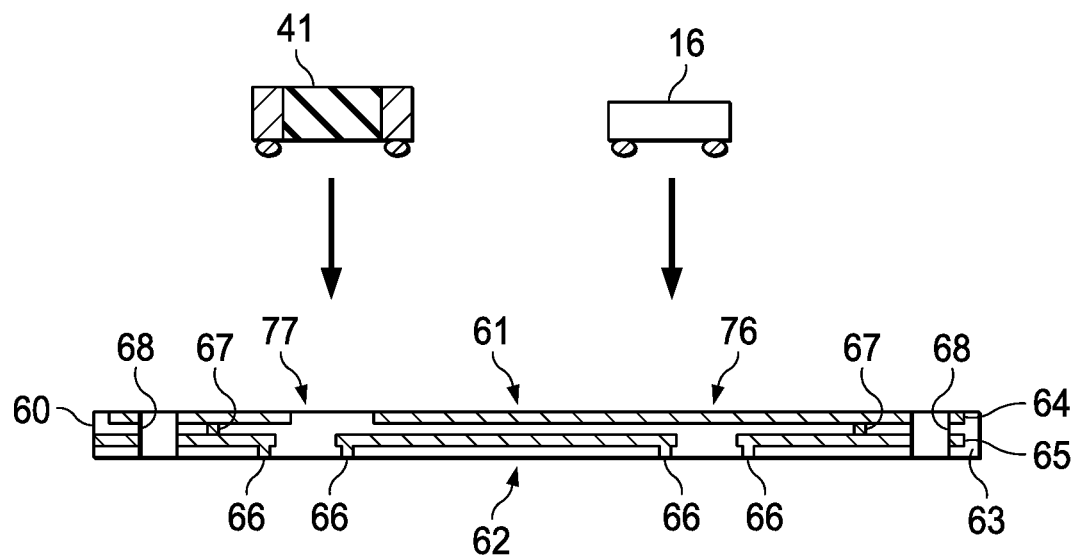

As described in further detail with respect to FIG. 3C, flexible circuit 60 may include multiple conductive circuit layers separated by a flexible insulating substrate. Flexible circuit 60 supports 3D signal routing with multiple conductive circuit layers, which can be interconnected via pin terminals 30 and/or conductive vias in the substrate of flexible circuit 60 that span between its circuit layers. In some examples, the 3D signal routing in flexible circuit 60 provides a ground return path within package 10.

Components of varying heights may be mounted on both sides of flexible circuit 60. For example, flexible circuit 60 may conform to semiconductor dies 12, 14 of varying heights that are first mounted via their backsides on substrate 20, before being electrically connected to flexible circuit 60. As described with respect to FIG. 3E, during assembly of package 10, flexible circuit 60 bends to conform to varying heights of semiconductor dies 12, 14 and associated electrical contact pads of die attach sites 72, 74 on surface 62 of flexible circuit 60.

As previously mentioned, a flexible circuit, such as flexible circuit 60, includes at least one conductive layer adjacent to at least one flexible dielectric layer, the at least one conductive layer including electrical contacts configured for connection to an electrical component or external device. Flexible circuit 60 includes at least one conductive layer, such as copper, aluminum or silver, disposed on a flexible dielectric substrate, such as polymide, PEEK, polyester. The conductive layer(s) may be applied by printing, such as photolithography or laser imaging. Different examples may include single-sided, double-sided, and multi-layer flexible circuits. In one particular example, flexible circuit 60 may include a first conductive layer forming control circuit layer 64 and a second conductive layer forming power stage circuit layer 65. In other examples, power stage conductors and control circuit conductors may share one or more conductive layers of a flexible circuit.

A flexible circuit, such as flexible circuit 60, exhibits a degree of elastic or inelastic flexibility that does not disrupt electrical connections formed between electrical component and/or external device provided by the flexible circuit. For example, the elastic or inelastic flexibility of a flexible circuit may be characterized by an ability to form a bend without damaging the conductors of the circuit layers or significantly interfering with the flexible insulating layer's insulating properties or position relative to the circuit layers. Different flexible circuit designs may facilitate bend radius under 25 millimeters, such as under 10 millimeters, such as under 5 millimeters. The bend radius of flexible circuit 60 suitable for use in package 10 will depend on the dimensions and layout of the package as well as the height variation of semiconductor dies 12, 14. Generally speaking, flexible circuit 60 must provide a bend radius small enough to allow an S-curve that aligns electrical contact pads of die attach sites 72, 74 on surface 62 of flexible circuit 60 with the electrical contacts of both of semiconductor dies 12, 14.

Package 10 differs in its construction from packages which utilize leadframes and/or wire bonds to form electrical connections between active and inactive electrical components. The described techniques for interconnecting components via a flexible circuit could also be utilized in combination with leadframes and/or wire bonds within a single package.

Package 10 includes substrate 20 with pin terminals 30 protruding from surface 21 of substrate 20 for electrically connecting package 10 to external components, for example, via a PCB or other underlying circuit. Substrate 20 serves as a structural platform for pin terminals 30 and provides a physical and thermal connection to semiconductor dies 12, 14 with thermal interface sites 28, 29 for semiconductor dies 12, 14. Surface 22 of substrate 20 opposes surface 21, and at least a section of surface 22 remains uncovered by mold compound 80 in an assembled package 10 such at substrate 20 supports conductive cooling of semiconductor dies 12, 14.

As shown in the figures, substrate 20 represents a direct bonded copper (DBC) substrate with ceramic layer 23, frontside copper layer 24, and backside copper layer 25. Frontside copper layer 24 includes thermal interface sites 28, 29 for semiconductor dies 12, 14, which facilitate conductive cooling of semiconductor dies 12, 14. Backside copper layer 25 is suitable to receive a heatsink or facilitate direct convective cooling depending on system requirements.

Substrate 20 may represent any substrate suitable for mounting pin terminals 30. In some examples, substrate 20 may include a ceramic layer with or without electrically conductive layers. Suitable configurations for substrate 20 include DBC, active metal brazed (AMB), insulated metal substrate (IMS), thick film ceramic substrate or other substrate facilitating sufficient convention for the power stages of semiconductor dies 12, 14. A thermally insulative substrate, such as a laminate substrate, is also possible so long as it includes thermally conductive insert(s) extending between surfaces 21, 22 as needed to provide conductive cooling, such as at thermal interface sites 28, 29.

In the described example, signals are not routed though conductive layers of substrate 20. However, examples in which signals are routed through conductive layers of substrate 20 are also contemplated. For example, such examples may utilize electrical connections between pin terminals 30 and conductive layers in substrate 20 to route electrical signals from and/or to components electrically connected to flexible circuit 60 over substrate 20. As particular examples, substrate 20 may include a grounded conductor which serves as a ground return path for electrical signals between components of package 10, such as control electrical signals between control die 16 and semiconductor dies 12, 14.

Pin terminals 30 are formed from electrically conductive materials, such as copper, aluminum, gold, platinum and/or other electrically conductive materials. Pin terminals may include plating or may be formed from a single metal alloy. A set of eight pin terminals 30 are shown: pin terminals 31, 32, 33, 34, 35, 36, 37, 38. However, the described examples may be readily adapted for packages includes any number of pin terminals.

As previously mentioned, substrate 20 provides a structural platform for pin terminals 30. Pin terminals 30 may be attached to one or more layers of substrate 20 by press fitting though apertures substrate 20 in and/or with conductive and/or nonconductive adhesives. In one particular example, pin terminals are secured to surface 21 of substrate 20 with a conductive adhesive such as solder. Such pin terminals may be physically and electrically connected to frontside copper layer 24. Frontside copper layer 24 may serve to electrically connect some of pin terminals 30, while other pin terminals 30 may be electrically isolated, for example, by breaks in frontside copper layer 24.

Flexible circuit 60 forms holes 68, which are mounted over pin terminals 30 to locate flexible circuit 60 in position relative to substrate 20. At least some of pin terminals 30 are electrically connected to the circuit layer(s) of flexible circuit 60 to provide electrical connections between components of package 10 and external components. In various examples, the electrical connections between the circuit layer(s) of flexible circuit 60 and pin terminals 30 may be formed by press-fit connection, solder connection and/or other electrical connection. In some examples, one or more of pin terminals 30 may also provide electrical connections between multiple circuit layers of flexible circuit 60. In the same or different examples, flexible circuit 60 may include one or more conductive vias extending between various circuit layers to provide electrical connections therebetween.

Pin terminals 30 provide electrical contacts for electrically connecting package 10 to external components, for example, via a PCB. As described in further detail with respect to FIG. 2, in an example in which semiconductor dies 12, 14 represent FETs in a half-bridge configuration, pin terminals 30 may include voltage input pin 31, high-side bootstrap pin 32, high-side FET source connection pin 33, high-side gate driver control input pin 34, low-side gate driver control input pin 35, gate drive power supply pin 36, ground pin 37, and switching node pin 38. The circuit diagram of FIG. 2 further includes a power ground pin 39, in such examples, pin terminal 37 may then represent an analog ground pin (to be paired with gate drive power supply pin 36). These pin terminals 30 are merely examples and package 10 may include fewer, different pin terminals, or additional pin terminals configured to electrically connect to external components as needed to support the operation of package 10.

Flexible circuit 60, control die 16 and semiconductor dies 12, 14 may also include additional pin terminals, conductive elements, and electrical contacts to provide support various functions of package 10. Such functions may include a low voltage power converter to serve control die 16, passive components 41, 43, 46 and/or external components. Additional functions may improve performance and reliability, such as over-current protection, over-temperature protection, and under voltage lockout. Passive components 41, 43, 46 may be part of sensing circuits, energy storage circuits, or other circuits supporting functions such as power conversion, over-current protection, over-temperature protection, and under voltage lockout for semiconductor dies 12, 14. For example, passive components 41, 43, 46 may be electrically connected to control die 16 via flexible circuit 60. Passive components 41, 43, 46 are merely conceptual examples, and passive components 41, 43, 46 may represent any number of components included in package 10, such as inductors, capacitors, resistors, diodes, passive sensors, or other components that support the functionality of package 10, control die 16 and semiconductor dies 12, 14.

The multiple circuit layers of flexible circuit 60 provide routable layers for complex circuit structures accommodating both control signals and power transmission of a power stage. Providing routable circuit layers with flexible circuit 60 increases the density of a power stage and its control die compared to alternatives which utilize single conductive layers, such as single leadframes. In addition, the routable layers of flexible circuit 60 allow for ground return paths within a package for electric signals between multiple elements of the package such as control die 16 and semiconductor dies 12, 14. This provides relative low package parasitics as compared to alternatives which rely on the ground plane of the underlying circuit by reducing the impedance of the signal loops.

While package 10 may include any semiconductor die architecture, its low signal loop impedance may be particularly useful for semiconductor dies 12, 14 and control die 16 utilizing higher frequency transmissions. For example, one or both of semiconductor dies 12, 14 and control die 16 may include GaN architecture, such as GaN-on-silicon or GaN-on-silicon carbide. In the same or different examples, one or both of semiconductor dies 12, 14 and control die 16 may include silicon architecture and/or gallium arsenide architecture. In one particular example, semiconductor dies 12, 14 may include GaN architecture, and control die 16 may include silicon architecture.

In addition, control die 16 may be specifically tuned to for a GaN configuration for semiconductor dies 12, 14 for fast driving while mitigating ringing on the gate. For example, control die 16 may be configured to keep semiconductor dies 12, 14 off for high drain slew rates, such as slew rates up to 150 V/ns. In addition, control die 16 may protect against faults by providing over-current protection, over-temperature protection, and/or under voltage lockout for semiconductor dies 12, 14. As control die 16 is an integrated component of package 10, the fault protection may be designed according to the specifications of semiconductor dies 12, 14, thereby simplifying the design of electronics utilizing package 10 as compared to alternatives in which fault protection for a semiconductor die is provided by separate components.

Mold compound 80 forms an overmold that covers semiconductor dies 12, 14, control die 16, passive components 41, 43, 46, both sides of flexible circuit 60 and one side of substrate 20. While the structure of flexible circuit 60 remains consistent before and after molding, flexible circuit 60 is constrained within mold compound 80 such that flexible circuit 60 is unable to bend or flex to a significant degree within package 10. In this manner, mold compound 80 provides a protective outer layer for the electric components of package 10. In other examples, a mold compound may only partially cover control die 16, and/or passive components 41, 43, 46, for example, to allow for convective cooling of such components. The exposed surface 22 of substrate 20 facilitates heat transfer from semiconductor dies 12, 14 to the external environment. Such heat transfer may be further improved by positioning the exposed surface 22 of substrate 20 on a heat sink.

Package 10 may be operated as a component of an intelligent power supply or other power control device. In various examples, package 10 may be utilized as part of a half-bridge, a boost converter, a buck converter, and others. In such examples, semiconductor dies 12, 14 may each represent a single power stage or include multiple power stages.

Figure 2:
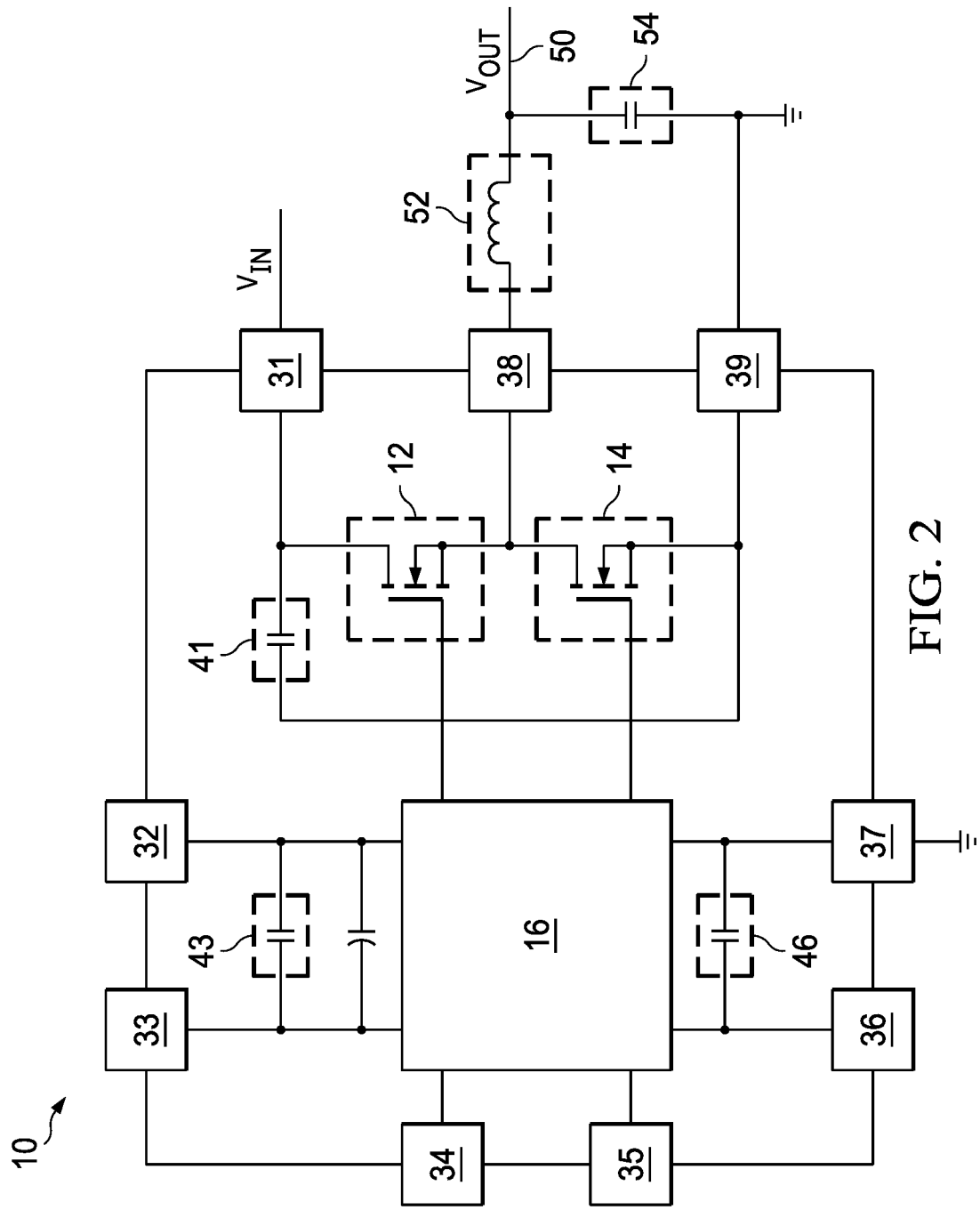
FIG. 2 is a simplified circuit diagram of one example configuration of the semiconductor package of FIGS. 1A-1C as used in a power converter.

FIG. 2 illustrates a simplified block diagram of an example configuration of semiconductor package 10 where semiconductor dies 12, 14 represent FETs in a half-bridge configuration. As shown in the FIG. 2, semiconductor die 12 represents the high-side FET, semiconductor die 14 represents the low-side FET, and control die 16 represents a driver for both the high-side FET and the low-side FET.

Voltage input pin 31 receives the power stage voltage input for the half-bridge, and is electrically connected to the high-side FET drain of semiconductor die 14. Switching node pin 38 is directed to power stage voltage output (Vout 50) via a power drain 52, such as inductor or transformer. The output of the power drain 52 is coupled to a voltage output capacitor 54 with the opposing side of voltage output capacitor 54 electrically connected to ground. While power drain 52 and voltage output capacitor 54 are depicted as being separate components from package 10, in some examples, either or both of power drain 52 and voltage output capacitor 54 may instead be integrated components of package 10.

Switching node pin 38 is electrically shorted to high-side FET source connection pin 33. Power ground pin 39 is electrically connected to the low-side FET source of semiconductor die 14, and it electrically shorted to ground pin 37.

In this example, passive component 43 represents a bootstrap capacitor between high-side bootstrap pin 32, and high-side FET source connection pin 33. The bootstrap capacitor may either be an integrated component of package 10 or an external component electrically connected via pin terminals 32, 33.

Passive component 41 represents the voltage input capacitor for the half-bridge. The voltage input capacitor may either be an integrated component of package 10 or an external component. However, including the voltage input capacitor as an integrated component of package 10, in combination with an internal ground return path facilitates a low inductance power loop for signals between the high-side FET and the low-side FET. Power loop parasitic impedance is limited by shortening the return path to the voltage input capacitor between the half-bridge connections to voltage input pin 31 and power ground pin 39. Internalizing the return path with package 10 by utilizing the circuit layers of flexible circuit 60 supports a short ground return path and thereby, a low power loop parasitic impedance. Providing a low power loop parasitic impedance may be particularly suitable to facilitate high-speed switching the high-side FET and the low-side FET, such as examples in which semiconductor dies 12, 14 include GaN FETs for the high-side FET and the low-side FET of the half-bridge.

A number of pin terminals 30 are electrically connected to control die 16. In this example, control die 16 receives inputs from high-side gate driver control input pin 34 and low-side gate driver control input pin 35. Control die 16 is configured to control switching of the high-side FET and the low-side FET of semiconductor dies 12, 14 by forwarding inputs on high-side gate driver control input pin 34 and low-side gate driver control input pin 35 to semiconductor dies 12, 14. Control die may also alter inputs on high-side gate driver control input pin 34 and low-side gate driver control input pin 35, for example, as part of over-current protection, over-temperature protection, and/or under voltage lockout functionality.

Control die 16 may be configured to match propagation delays between the external high-side gate driver (for signals coming on high-side gate driver control input pin 34) and external low-side gate driver (for signals coming on low-side gate driver control input pin 35) to allow very tight control of dead time. Controlling the dead time is particularly important for GaN-based semiconductor dies 12, 14 to maintain high efficiency.

Gate drive power supply pin 36 provides low-voltage power to control die 16, and ground pin 37 provides an analog ground connection to control die 16. In this example, passive component 46 represents a decoupling capacitor between gate drive power supply pin 36 and ground pin 37 to filter the voltage on gate drive power supply pin 36. The decoupling capacitor may either be an integrated component of package 10 or an external component.

In many examples, semiconductor dies 12, 14 with power FETs operate at a higher current and/or voltage than control die 16. For example, a voltage rating of the power FETs may be at least 50 volts, such as at least 80 volts, such as at least 100 volts, such as at least 200 volts, such as at least 400 volts. In contrast, the power FETs of semiconductor dies 12, 14 may be operable by control die 16 with gate signals providing no more than ten percent of the voltage rating of the power FETs, such as a signal of less than two percent of the voltage rating, such as voltage of less than 15 volts.

Due to the higher voltages and/or currents of power stage signals associated with semiconductor dies 12, 14 compared to control die 16, power stage signals may be carried on multiple conductors. For example, semiconductor dies 12, 14 are depicted as including nine electrical contacts each in FIG. 1A. By way of non-limiting example, these nine electrical contacts might include four contacts for Source, four contacts for Drain and a single contact for Gate.

Package 10 may further include additional functionality for control die 16, such as sensing functions for over-current protection, over-temperature protection, and/or under voltage lockout for semiconductor dies 12, 14. For example, package 10 may include current sensing and/or voltage sensing of the power stages. As another example, package 10 may include provide temperature sensing for semiconductor dies 12, 14 or package 10 generally. Such sensing may be incorporated into the functionality of control die 16 to provide over-current protection, over-temperature protection, and/or under voltage lockout for the power stages of package 10. Such protection may include altering inputs on high-side gate driver control input pin 34 and low-side gate driver control input pin 35 rather than forwarding them to semiconductor dies 12, 14. Control die may also output sensing information, such as error codes representing sensed information, which may include power stage currents, power stage voltages, and/or package temperatures.

In addition, various the power stage configurations are contemplated for semiconductor dies 12, 14. For example, while the terms gate, source, and drain are generally associated with FET power stages, the techniques disclosed herein also apply to other power stages, such as IGBT, BJT, thyristor, IGCT, SCR, TRIAC, HEMT, and UJT power stages, which may be incorporated into semiconductor dies 12, 14 in a half-bridge configuration or otherwise.

FIGS. 3A-3H illustrate conceptual process steps for manufacturing semiconductor package 10. FIG. 4 is flowchart of a method of manufacturing package 10. For clarity, the techniques of FIG. 4 are described with respect to package 10 and FIGS. 3A-3H, however, the described techniques may be adapted to other package designs and are not limited to the specific example of package 10.

FIGS. 3A and 3B represent process steps to manufacture a subassembly 6, which includes substrate 20, pin terminals 30 (pin terminals 31, 38 are shown), and semiconductor dies 12, 14, which include power stages for package 10. As shown in FIG. 3A, thermal interface materials 13,15 are applied to substrate 20 at thermal interface sites 28, 29 to facilitate forming thermal and physical connections between substrate 20 and semiconductor dies 12, 14. In other examples, thermal interface materials 13,15 are applied to semiconductor dies 12, 14 before semiconductor dies 12, 14 are positioned at thermal interface sites 28, 29.

As shown in FIG. 3B, semiconductor dies 12, 14, each including at least one power stage, are physically and thermally coupled to frontside copper layer 24 on surface 21 substrate 20 (FIG. 4, step 202). Specifically, the backside of semiconductor die 12 is attached to substrate 20 with thermal interface material 13 at thermal interface site 28, and the backside of semiconductor die 14 is attached to substrate 20 with thermal interface material 15 at thermal interface site 29.

In various examples, thermal interface materials 13,15 may represent any suitable thermally conductive adhesive material, such as thermally conducive tapes or thermally conducive adhesive pastes, such as thermally conducive epoxies. In addition to being thermally conductive, thermal interface materials 13,15 must also provide sufficient adhesion to hold semiconductor dies 12, 14 in place on surface substrate 20 during the assembly of package 10.

Figure 3D:
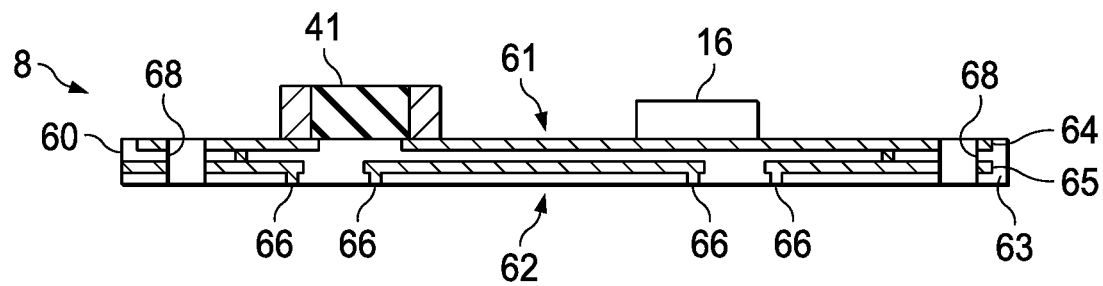
Figure 4:
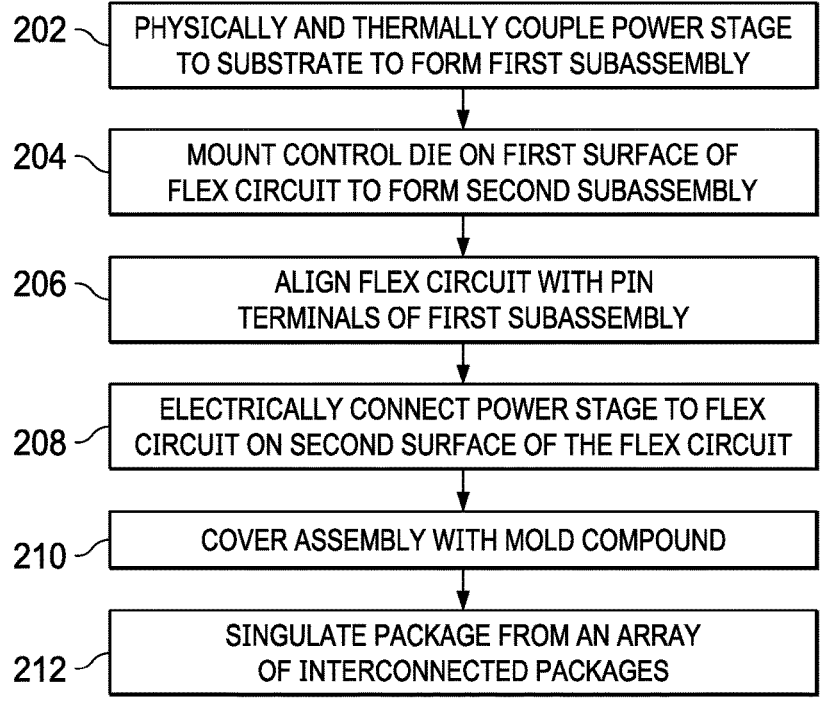
FIG. 4 is a flowchart of a method of manufacturing a semiconductor package including FET power stages in a half-bridge configuration and a control die on opposing surfaces of a flexible circuit, such as the semiconductor package of FIGS. 1A-1C.

FIGS. 3C and 3D represent process steps to manufacture a subassembly 8, which includes flexible circuit 60, control die 16 and passive component 41. Subassembly 8 may further include additional components, such as passive components 43, 46 (not shown). In any event, the components of subassembly 8 are each mounted to surface 61 of flexible circuit 60 such that the components are physically and electrically connected to circuit layer 64 (FIG. 4, step 204). The physical and electrical connections between flexible circuit 60 and the components of subassembly 8 may be formed by reflow processing a set of solder bumps.

In the example of FIGS. 3C and 3D, flexible circuit 60 includes two circuit layers 64, 65 separated by a layer of flexible electrically insulating substrate 63, such as polyamide or polyimide. Circuit layers 64, 65 may be formed from electrically conductive materials, copper or gold or other metal with relatively small thicknesses, such as thicknesses between 0.5 mil and 2.0 mil. The base conductive material may also be plated in some examples, which may inhibit corrosion and/or facilitate electrical connections between the circuit layers and components mounted to flexible circuit 60.

Circuit layer 64 is depicted in the figures as being exposed on outer surface 61 of flexible circuit 60 to facilitate direct electrical connections between electrical contact surfaces of circuit layer 64 and the components mounted to flexible circuit 60 on surface 61, including control die 16 and passive component 41. In contrast circuit layer 65 is depicted in the figures as being sandwiched between two layers of flexible electrically insulating substrate 63, with a first insulating substrate layer between semiconductor dies 12, 14 and circuit layer 65 and a second insulating substrate layer on the opposite side of circuit layer 65. This second insulating substrate layer is between circuit layer 65 and circuit layer 64. Locating circuit layer 65 between two layers of flexible electrically insulating substrate 63 may help prevent shorts within package 10, such as between circuit layer 65 and substrate 20. Electrical contact vias 66 extend from circuit layer 65 to surface 62 of flexible circuit 60 to facilitate electrical connections between circuit layer 65 and components to be mounted on flexible circuit 60 on surface 62, including semiconductor dies 12, 14.

Circuit layers 64, 65 electrically connect to some of pin terminals 30 as needed to support the functionality of package 10. Optionally, circuit layers 64, 65 may be electrically connected to each other through one or more of pin terminals 30. For example, a grounded portion of power stage circuit layer 65 may be electrically connected to a grounded portion of the control circuit layer 64 via a ground pin, such as power ground pin 39 and/or or an analog ground pin 37. The ground pin and the grounded portion of the control circuit layer 64 may provide a ground return path for an electrical signal between an input of the power stage of either or both of semiconductor dies 12, 14 and the control signal outputs of control die 16.

In addition to, or as an alternative to electrical connections utilizing pin terminals 30, flexible circuit 60 may include optional circuit layer vias 67 extending between circuit layers 64, 65 within flexible electrically insulating substrate 63 separating circuit layers 64, 65. Circuit layer vias 67 provide direct electrical connections between circuit layers 64, 65.

Circuit layer 64 may be referred to as control circuit layer as it may provide relatively low voltage connections between external drivers, control die 16 and sensors or other low voltage passive components. Control circuit layer 64 may also include some high voltage conductors, for example, to connect passive components located on surface 61 of flexible circuit 60 to power stages of semiconductor dies 12, 14 as part of a half-bridge or other high-voltage circuit. In other examples, circuit layer 65 may directly electrically connect to passive components located on surface 61 of flexible circuit 60 with conductive vias extending from power stage circuit layer 65 to surface 61 of flexible circuit 60. In such examples, high voltage signals may be routed only on power stage circuit layer 65 and the conductive vias.

In contrast, circuit layer 65 may be referred to as a power stage circuit layer as it includes conductors for relatively higher voltage power stage signals. Generally, power stage circuit layer 65 will also provide some low voltage connections, such as conductors that carry signals between control die 16 and semiconductor dies 12, 14. In other examples, control circuit layer 64 may directly electrically connect to semiconductor dies 12, 14 with conductive vias extending from control circuit layer 64 to surface 62 of flexible circuit 60. In such examples, low voltage signals may be routed only on control circuit layer 64 and the conductive vias.

A ground return path for power stage signals between semiconductor dies 12, 14, for example, as part of a half-bridge, may be contained entirely within power stage circuit layer 65, or may also include portions of control circuit layer 64. A ground return path for signals between control die 16 and semiconductor dies 12, 14 will generally include portions of both control circuit layer 64 and power stage circuit layer 65 as semiconductor dies 12, 14 electrically connect to power stage circuit layer 65 and control die 16 electrically connects to control circuit layer 64. However, control circuit layer 64 may directly electrically connect to semiconductor dies 12, 14 with conductive vias extending from power stage circuit layer 65 to surface 61 of flexible circuit 60 such that the ground return path for signals between control die 16 and semiconductor dies 12, 14 is limited to control circuit layer 64 and the conductive vias. In this manner, flexible circuit 60 supports 3D signal routing with multiple circuit layers, which can be interconnected via pin terminals 30 and/or conductive vias in flexible circuit 60 substrate that span between the circuit layers of flexible circuit 60.

Including a ground return path within the package provides for a lower impedance for electronic signals between the semiconductor die and a control die as compared to packages that rely on the ground plane of an underlying circuit. Limiting the impedance of the signal path may mitigate voltage overshoot, thereby facilitating higher frequency communications, as voltage overshoot can interfere with signal transmission. The disclosed techniques are applicable to any semiconductor dies, and may be particularly useful higher frequency transmissions, such as gallium nitride (GaN) dies. For example, GaN architecture, such as GaN-on-silicon or GaN-on-silicon carbide, have been demonstrated as supporting higher frequencies as compared to silicon architecture or gallium arsenide architecture.

Figure 3E:
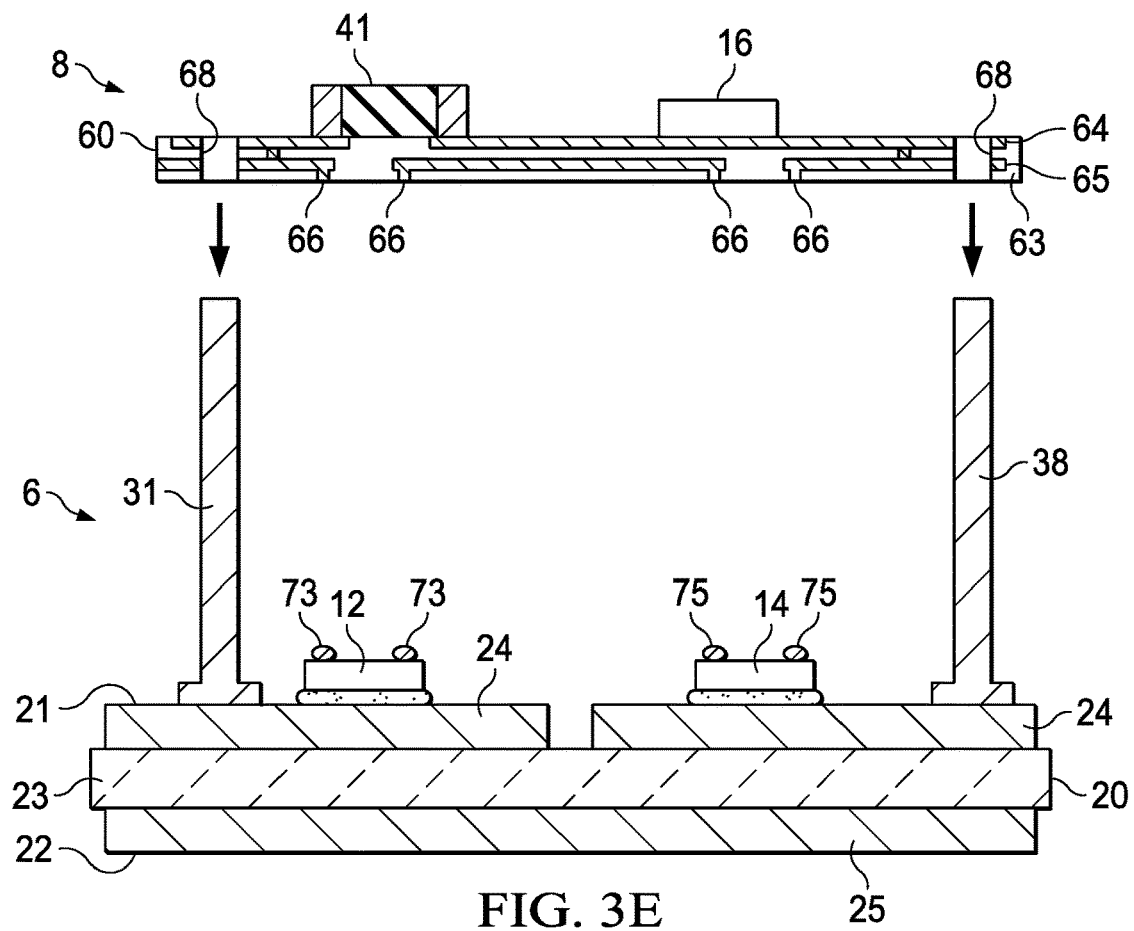
Figure 3F:
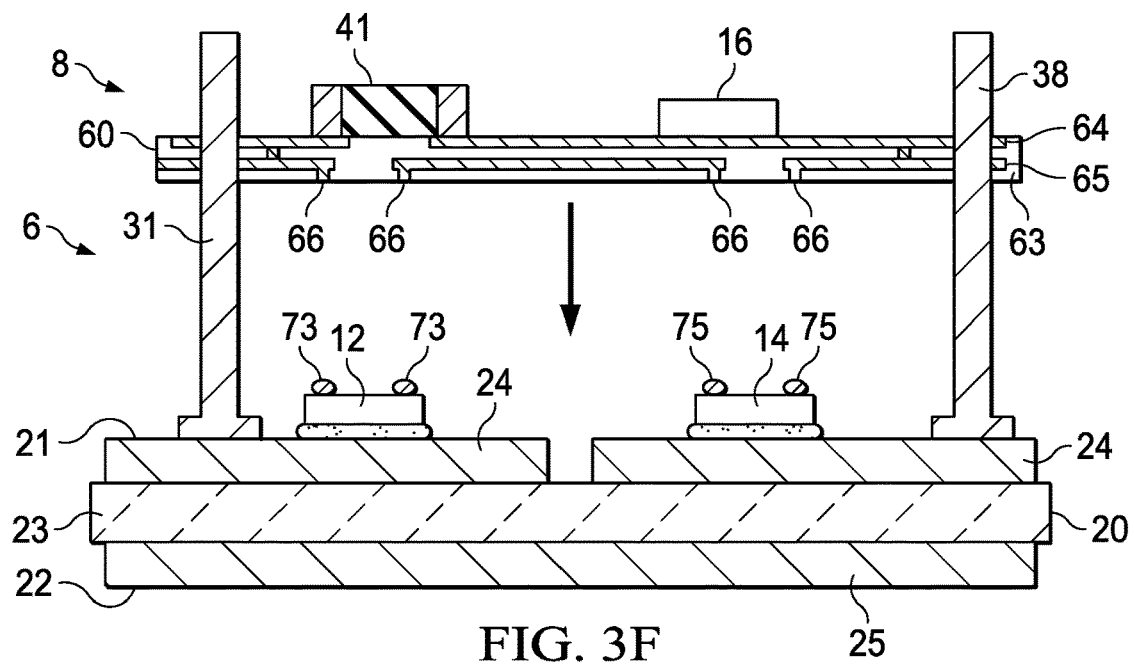

As shown in FIGS. 3E and 3F, following the construction of subassembly 6 (FIG. 3B) and subassembly 8 (FIG. 3D), through holes 68 of flexible circuit 60 are aligned with pin terminals 30, including pin terminals 31, 38 as shown in FIGS. 3E and 3F. Once through holes 68 of flexible circuit 60 are aligned with pin terminals 30, assembly 8 is moved in place with pin terminals 30 within holes 68 to locate electrical contacts of semiconductor dies 12, 14 proximate electrical contact surfaces of the power stage circuit layer 65 (FIG. 4, step 206). In this manner, through holes 68 represent alignment features of flexible circuit 60 engaged with pin terminals 30. Other examples may include additional or different alignment features, such as notches, bumps or other elements configure to mate with pin terminals 30 or other elements of subassembly 6.

The disclosed techniques facilitate mounting and electrical connections to components of varying heights on both sides of flexible circuit 60. During assembly of package 10, flexible circuit 60 bends to conform to electrical contacts of semiconductor dies 12, 14 at varying heights to facilitated electrical connections with associated electrical contact pads of die attach sites 72, 74 on surface 62 of flexible circuit 60. For example, flexible circuit 60 may conform to semiconductor dies 12, 14 of varying heights that are first mounted via their backsides on substrate 20, before being electrically connected to flexible circuit 60. In addition, the flexibility of flexible circuit 60 may also improve the reliability of electrical connections between semiconductor dies 12, 14 and flexible circuit 60 when semiconductor dies 12, 14 have the same heights but variations in manufacturing result in different heights for semiconductor dies 12, 14 as mounted to substrate 20.

Figure 3G:
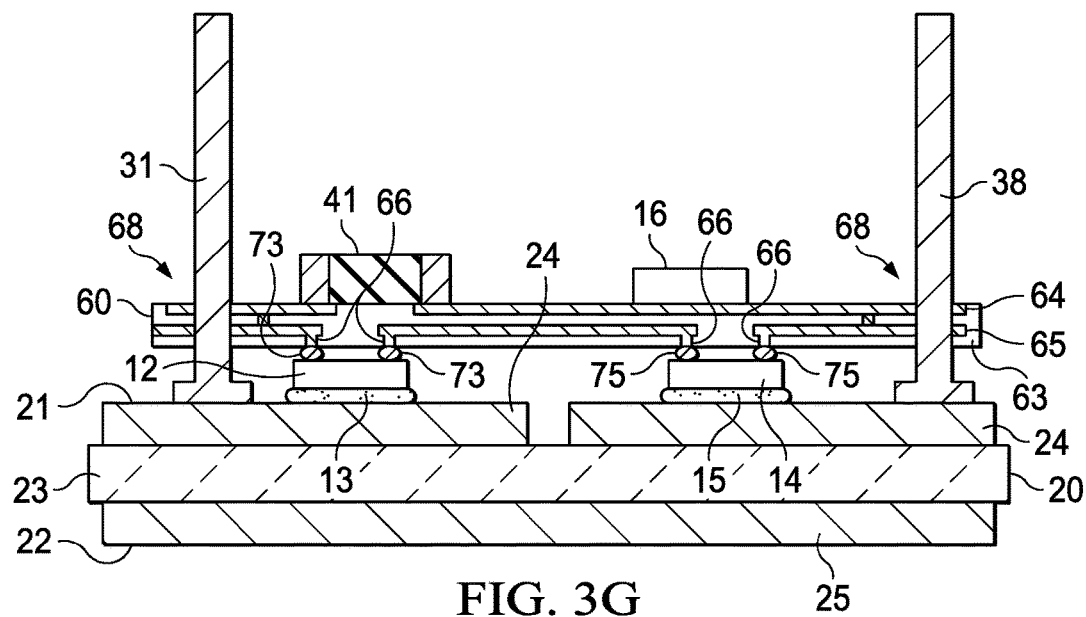

As shown in FIG. 3G, when subassembly 6 and subassembly 8 are in position relative to each other, flexible circuit 60 is opposite substrate 20 relative semiconductor dies 12, 14 such that semiconductor dies 12, 14 are between flexible circuit 60 and substrate 20. In addition, control die 16 is mounted on flexible circuit 60 opposite semiconductor dies 12, 14 such that control die 16 is electrically coupled to control circuit layer 64. In this position, solder ball grid arrays 73, 75 are reflowed to electrically connect semiconductor dies 12, 14 to electrical contact surfaces of power stage circuit layer 65, thereby electrically connecting the power stage of semiconductor dies 12, 14 in subassembly 6 to the power stage circuit layer 65 of subassembly 8 (FIG. 4, step 208). When reflow processing occurs serially, it is important that completed solder reflows are not melted during the formation of additional solder reflows. For this reason, the melting temperature of completed solder reflows should be higher than the melting temperature of solder bumps for later solder reflows. For this reason, it may be desirable to use a solder with a lower melting temperature for solder ball arrays 73, 75 as compared to solder for electrical connections between components of subassembly 8 to prevent melting the solder of subassembly 8 during the reflow processing to electrically connect semiconductor dies 12, 14 to electrical contact surfaces of power stage circuit layer 65 on surface 62 of flexible circuit 60.

Figure 3H:
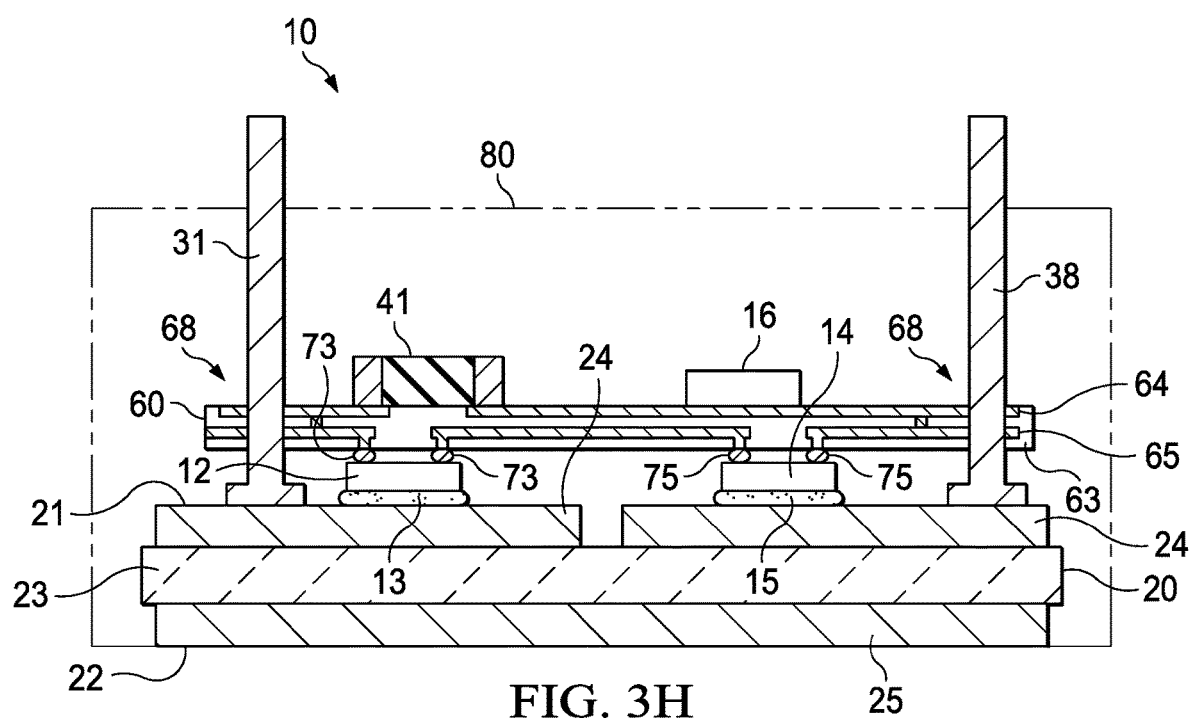

As shown in FIG. 3H, the assembly of subassembly 6 and subassembly 8 is covered in mold compound 80, leaving surface 22 of substrate 20 opposite semiconductor dies 12, 14 exposed (FIG. 4, step 210). While the structure of flexible circuit 60 remains consistent before and after molding, flexible circuit 60 is constrained by mold compound 80 such that flexible circuit 60 is unable to bend or flex to a significant degree within package 10.

In examples, in which package 10 is mounted as part of a package strip, following molding of mold compound 80, package 10 is singulated from an array of interconnected packages manufactured on a common substrate including substrate 20 (FIG. 4, step 212). For example, singulation may include cutting through mold compound 80 and ceramic layer 23 of substrate 20 to separate package 10 from a plurality of packages manufactured on the common substrate.

Figure 5:
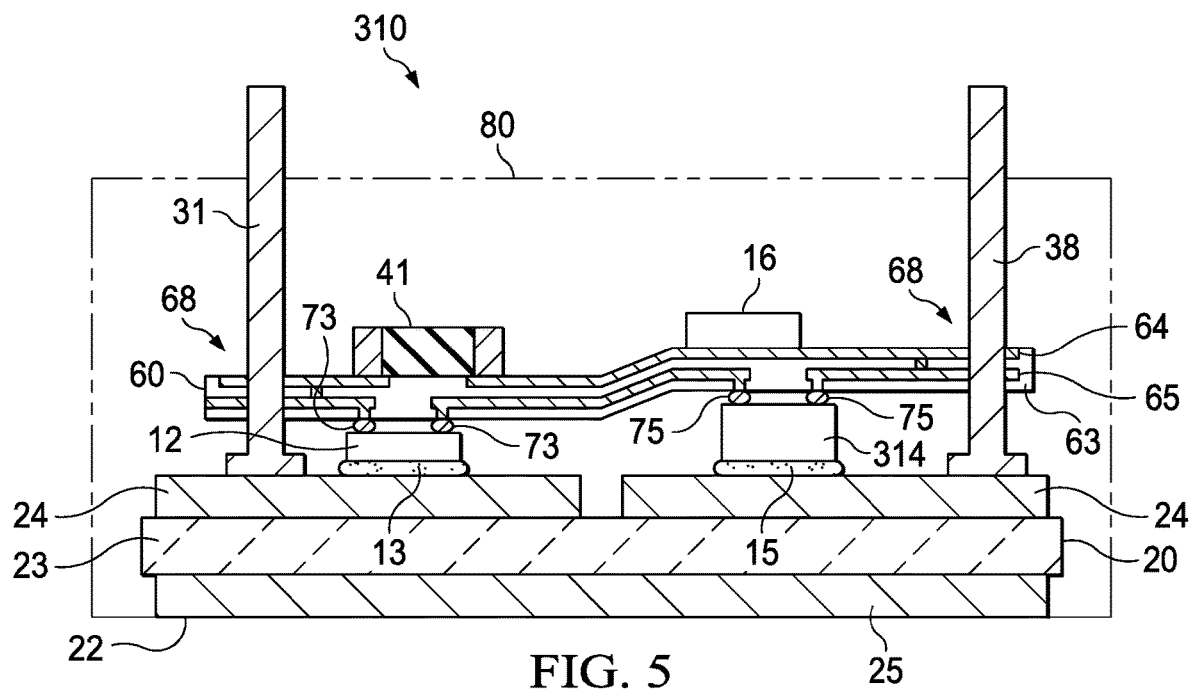
FIG. 5 is a conceptual view of a semiconductor package similar to the semiconductor package of FIGS. 1A-1C, with dies of varying heights mounted to the backside of the flexible circuit.

FIG. 5 is a conceptual view of a semiconductor package similar to the semiconductor package 10, except that semiconductor dies 12, 314 have varying heights. In this manner, package 310 is substantially similar to semiconductor package 10 except that semiconductor die 14 has been replaced by semiconductor die 314. Except as specifically noted, the description of package 10 applies to package 310, and semiconductor die 314 is functionally the same as semiconductor die 14, except for the greater thickness of semiconductor die 314. For example, semiconductor dies 12, 314 each a power stage, such as a single channel power FET, and the power stages may represent components of a half-bridge. Package 310 includes semiconductor dies 12, 314 and control die 16 on opposing surfaces of flexible circuit 60. Package 310 further includes substrate 20, which supports conductive cooling from semiconductor dies 12, 14. For brevity, additional details included in the description of package 10 are not repeated with respect to package 310.

In contrast to semiconductor die 14, semiconductor die 314 is thicker than semiconductor die 12. As shown in FIG. 5, flexible circuit 60 has bent to conform to the varying heights of semiconductor dies 12, 314. In the example of package 310, flexible circuit 60 may be designed with an expected bend in order to facilitate alignment of electrical contact pads of flexible circuit 60 with solder ball grid arrays 73, 75 of semiconductor dies 12, 314. For example, when flexible circuit 60 is held flat prior to assembly over pin terminals 31, 38, holes 68 may be further apart than pin terminals 31, 38 to allow for the expected bending of flexible circuit 60 once placed over semiconductor dies 12, 314. A solder reflow process to electrically connect semiconductor dies 12, 314 with power stage circuit layer 65 may then hold flexible circuit 60 in the bent position adjacent semiconductor dies 12, 314.

The specific techniques for packages including a flexible circuit, including techniques described with respect to semiconductor package 10 and semiconductor package 310, are merely illustrative of the general inventive concepts included in this disclosure as defined by the following claims.

What is claimed is:
1. A semiconductor package comprising:
a substrate forming a first surface and a second surface that opposes the first surface;
a set of terminals protruding from the first surface of the substrate;
a power stage directly attached to the first surface of the substrate via an adhesive;
a substrate layer including at least one circuit layer forming power stage conductors and control circuit conductors, wherein the power stage is mounted on a first surface of the substrate layer such that the power stage is electrically connected to the power stage conductors,
wherein the power stage is between the substrate layer and the substrate; and
a die mounted on a second surface of the substrate layer opposite the power stage such that the die is electrically connected to the control circuit conductors,
wherein an output of the die is electrically connected to an input of the power stage via the control circuit conductors.
2. The semiconductor package of claim 1, wherein the substrate layer includes alignment features engaged with the set of terminals protruding from the substrate.
3. The semiconductor package of claim 1, wherein a grounded portion of the power stage conductors is electrically connected to a grounded portion of the control circuit conductors via a ground pin of the set of terminals.
4. The semiconductor package of claim 3, wherein the grounded portion of the power stage conductors, the ground pin and the grounded portion of the control circuit conductors provide a ground return path for an electrical signal between the input of the power stage and the output of the die.
5. The semiconductor package of claim 1, wherein the output of the die is electrically connected to the input for the power stage via the control circuit conductors and one of the set of terminals.
6. The semiconductor package of claim 1,
wherein the power stage is a first power stage,
the semiconductor package further comprising a second power stage physically and thermally coupled to the first surface of the substrate such that the second power stage is between the substrate layer and the substrate,
wherein the first power stage is electrically connected to the second power stage via the power stage conductors.

7. The semiconductor package of claim 1, wherein the substrate layer includes a first insulating substrate layer, and a second insulating substrate layer on an opposite side of the power stage conductors relative to the first insulating substrate layer.

8. The semiconductor package of claim 1, wherein the control circuit conductors are on an outer surface of the substrate layer.

9. The semiconductor package of claim 1, wherein the adhesive is a thermal interface material between the power stage and the first surface of the substrate.

10. The semiconductor package of claim 1, further comprising:
a first set of solder bumps forming electrical connections between the power stage and the substrate layer.

11. The semiconductor package of claim 1, further comprising one or more passive components of a sensing circuit mounted on the second surface of the substrate layer and electrically connected to the die via the control circuit conductors.

12. The semiconductor package of claim 1, further comprising a mold compound at least partially covering the power stage, the die, the substrate layer and the substrate with the second surface of the substrate exposed.

13. The semiconductor package of claim 1, further comprising a heat sink physically and thermally coupled to the second surface of the substrate.

14. The semiconductor package of claim 1, wherein the power stage includes at least one a group consisting of:
a field effect transistor (FET);
a junction FET (JFET);
a metal-oxide-semiconductor field-effect transistor (MOSFET);
a metal-semiconductor field-effect transistor (MESFET);
an insulated-gate bipolar transistor (IGBT);
a bipolar junction transistor (BJT);
a thyristor;
an integrated gate commutated thyristor (IGCT);
a silicon controlled rectified (SCR);
a triode for alternating current (TRIAC);
a high electron mobility transistor (HEMT); and
a uni junction transistor (UJT).

15. The semiconductor package of claim 1, wherein a voltage rating of the power stage is at least 80 volts.

16. The semiconductor package of claim 1, wherein the substrate layer is a flexible substrate layer including a bend radius under 25 millimeters.

17. The semiconductor package of claim 1, further comprising a gallium nitride die that includes the power stage.

18. A semiconductor package comprising:
a substrate forming a first surface of the substrate, and a second surface of the substrate, the second surface of the substrate opposing the first surface of the substrate;
a set of terminals protruding from the first surface of the substrate;
a first gallium nitride die forming a first power stage directly attached via an adhesive to the first surface of the substrate;
a second gallium nitride die forming a second power stage directly attached via an adhesive to the first surface of the substrate;
a flexible circuit including a power stage circuit layer and a control circuit layer separated by a flexible insulating substrate layer;
wherein the first gallium nitride die is mounted on a first surface of the flexible circuit such that the first power stage is electrically connected to the power stage circuit layer, and the second gallium nitride die is mounted on the first surface of the flexible circuit such that the second power stage is electrically connected to the power stage circuit layer,
wherein the first power stage is electrically connected to the second power stage via the power stage circuit layer,
wherein the flexible circuit is opposite the substrate relative the first power stage and the second power stage such that the first power stage and the second power stage are between the flexible circuit and the substrate,
wherein the flexible circuit forms alignment features engaged with the set of terminals protruding from the substrate;
a die mounted on the flexible circuit opposite the first power stage and the second power stage such that the die is electrically connected to the control circuit layer, wherein an output terminal of the die is electrically connected to an input for at least one of the first power stage and the second power stage via one of the set of terminals; and
a mold compound at least partially covering the first gallium nitride die, the second gallium nitride die, the die, the flexible circuit and the substrate with the second surface of the substrate exposed.

* * * * *